United States Patent [19]

Ueda et al.

[11] Patent Number: 5,065,116
[45] Date of Patent: Nov. 12, 1991

[54] ZERO PHASE RESTART COMPENSATION FOR VCO

[75] Inventors: Shunsaku Ueda, Oceanside; Rodney T. Masumoto, Irvine, both of Calif.

[73] Assignee: Silicon Systems Inc., Tustin, Calif.

[21] Appl. No.: 646,867

[22] Filed: Jan. 28, 1991

[51] Int. Cl.⁵ .............................................. H03B 1/00
[52] U.S. Cl. .................................................... 331/173
[58] Field of Search .................. 331/1 A, 25, 172, 173

[56] References Cited

U.S. PATENT DOCUMENTS

| | | | |
|---|---|---|---|
| 4,272,736 | 6/1981 | Gercekci et al. | 331/173 X |
| 4,682,178 | 7/1987 | Anflo et al. | 331/172 X |
| 4,727,339 | 2/1988 | Doty, II et al. | 331/173 |
| 4,851,789 | 7/1989 | Dobos | 331/173 X |
| 4,908,583 | 3/1990 | Haight | 331/173 X |

Primary Examiner—Robert J. Pascal
Attorney, Agent, or Firm—Hecker & Harriman

[57] ABSTRACT

A zero-phase restart circuit that provides a new circuit element in the path of the incoming data signal in order to delay the data signal by an amount equal to the delay caused by the restart circuitry. This ensures that the phase difference between the two signals will be zero at restart and thus effectively cancels out the residual error seen with the prior art. This technique remains effective well into higher data rates. The advantages of the present invention allows the circuit to operate near its limit without suffering large transients on the VCO control voltage and the VCO frequency. The overall system will not be limited by the transient response on the VCO control voltage nor the VCO frequency. It allows for higher operating speeds of data. Further, the new method will allow the system to better tolerate the jitter of the incoming data such that the restrictions on the jitter performance of the incoming data can be reduced substantially, i.e., allow more jitter to exist on the data.

14 Claims, 2 Drawing Sheets

ZERO PHASE RESTART COMPENSATION FOR VCO

BACKGROUND OF THE INVENTION

1. Field of the Invention

This invention relates to the field of restart circuitry for a voltage controlled oscillator (VCO) with zero phase compensation.

2. Background Art

Information in computer systems is often transmitted or exchanged in bit stream format. A bit stream consists of a series of logical "1's" or "0's" presented in serial fashion. To accurately decode a serial bit stream, bit frames or bit windows, also known as data recovery windows and decode windows, must be accurately defined. One to one correspondence exists between each bit and each decode window. If the decode window is too large, more than one bit of information may be contained within the window and one or all bits may be lost. If the decode window is too small, no detectable information will result. Further, loss of bit information at point locations may lead to error propagation through the decoding process.

For a variety of reasons, data bit streams may include a degree of "jitter" which tends to force a data bit near a decode window boundary. Jitter is often due to phase errors.

Many integrated circuit applications utilize a voltage controlled oscillator (VCO) to provide timing signals to a data recovery circuit. In some applications, the VCO is used as part of a phased lock look (PLL) as, for example, in connection with a data synchronizer. A VCO is a timing device that provides an output of a certain frequency. The nominal operating frequency of a VCO is referred to as its "center frequency". The VCO can be made responsive to a control voltage $V_C$ so that the output of the VCO can be modified to be greater than or less than the center frequency as required.

A PLL consists of a phase detector, amplifier, filter and VCO. The phase detector compares two input frequencies to generate an output that is a measure of their phase difference. One of the input frequencies is a source signal and the other is the output of the VCO. If the input signals differ in frequency, the phase detector provides a periodic output at the difference frequency. This phase error signal is then filtered and amplified to generate a control voltage $V_c$ that causes the frequency of the VCO to change in the direction of the frequency of the source signal. Eventually, the feedback loop causes the VCO to "lock" to the frequency of the source signal and maintain a fixed phase relationship with the source signal.

The phase comparator circuitry is sensitive to the relative timing of edges between the source signal and the VCO output. The phase comparator generates a lag or lead signal depending on whether the transitions of the VCO output occur before or after the transitions of the source signal. The width of the pulses is equal to the time between the edges of the two input signals to the phase comparator.

In a data recovery system, when data is provided to the system, the VCO is restarted so that the data recovery system can "lock onto" the phase and/or frequency of the data. The VCO output is a locally generated frequency matching the frequency of the input signal, thus providing a clean replica of the input signal frequency. This can compensate for noise that may be present in the input signal. By adjusting the VCO control voltage, the VCO frequency matches the data frequency.

The output of the VCO is provided to a phase detector along with the input signal. The phase detector, driven by the output of the VCO can lock onto the phase of the input signal.

In some data recovery systems, a technique to restart the VCO in the same phase with the incoming data is employed to minimize initial phase error to reduce the transient VCO control voltage and frequency excursion. This is to minimize the frequency and/or phase acquisition period.

In prior art, however, this restart circuitry does not include a compensation of itself, thus, there exists a residual initial phase error. At low data rates (VCO frequency) with relatively large period (in comparison to the residual error), the prior art system shows small control voltage and frequency excursion. But as the incoming data rate increases, so does the voltage excursion and frequency excursion of the VCO, both in absolute terms as well as percentage of the final value.

At high VCO frequency and speeds near the limits of the circuit, the residual error becomes significant. The transient caused by this residual error approaches the worst case possible as though there were no restart circuit. The voltage and frequency excursion of the VCO under this condition is comparable to a VCO which has no zero-phase restart circuitry.

SUMMARY OF THE PRESENT INVENTION

The zero-phase restart circuitry of the present invention provides a new circuit element in the path of the incoming data signal in order to delay the data signal by an amount equal to the delay caused by the restart circuitry. This ensures that the phase difference between the two signals will be zero at restart and thus effectively cancels out the residual error seen with the prior art. This technique remains effective well into higher data rates.

The advantages of the present invention allows the circuit to operate near its limit without suffering large transients on the VCO control voltage and the VCO frequency. The overall system will not be limited by the transient response on the VCO control voltage nor the VCO frequency. It allows for higher operating speeds of data. Further, the new method allows the system to better tolerate the jitter of the incoming data such that the restrictions on the jitter performance of the imcoming data can be reduced substantially, i.e., allow more jitter to exist on the data.

DETAILED DESCRIPTION OF THE PRESENT INVENTION

The present invention is directed to an apparatus for providing zero-phase restart circuitry in a data recovery system. In the following description, numerous specific details, such as flip-flop type, voltage, etc., are set forth in order to provide a more thorough understanding of the present invention. It will be apparent, however, to one skilled in the art, that the present invention may be practiced without these specific details. In other instances, well known features have not been described in detail in order not to obscure the present invention.

The present invention provides an improvement element to the restart circuitry of prior art so that residual phase error is compensated for at high speed data rates.

Figure 1:
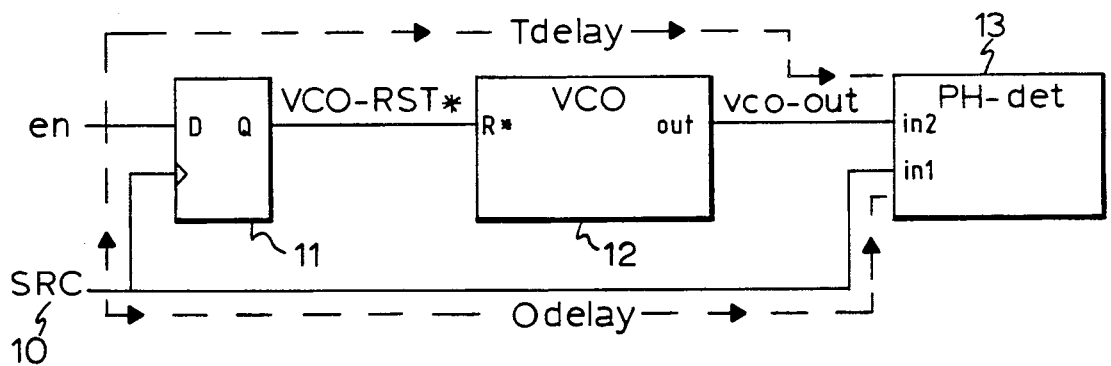
FIG. 1 is a diagram illustrating a prior art zero-phase restart circuit.

A block diagram illustrating a prior art zero-phase restart circuit is illustrated in FIG. 1. The prior art consists of a D-type flip-flop 11, a VCO 12 and a phase detector 13. Incoming data signal SRC 10 is received by the phase detector 13 through two different paths; directly and through the restart circuit. Data signal SRC 10 is coupled to the clock input of D-type flip-flop 11, and is also coupled to input in1 of phase detector 13. The output 21 of flip-flop 11 is coupled to the reset input of VCO 12. The output 22 of VCO 12 is coupled to input in2 of phase detector 13. A control voltage $V_c 27$ is coupled in a feedback loop to VCO 12.

In operation, a data pulse SRC 10 clocks the flip-flop 11. This removes a reset signal output 21 from flip-flop 11. This reset signal 21 is provided to VCO 12. The removal of reset signal 21 restarts the VCO. The VCO then provides a clock output 22 of a certain frequency to phase detector 13.

At the same time, the input signal SRC 10 is provided directly to phase detector 13 on line 23. There is a delay $T_{delay}$ associated with the path 24 from SRC signal 10 through the flip-flop 11 and VCO 12 to the input of phase detector 13. There is zero delay associated with the path 25 from the SRC 10 input signal directly to the phase detector 13. This creates a residual phase error between the two input signals on the phase detector 13.

The residual phase error between the two input signals of phase detector 13 is $(2\pi \times T_{delay})/T_{data}$, where $T_{data}$ is the period of the data rate at SRC 10. The effects of this phase error are reflected at input in2 of phase detector 13 at $T_{delay}$ time later, while at input in1 of phase detector 13, it will be instantaneous (zero delay). The residual phase error in the circuit of FIG. 1 is the difference in the arrival time between in2 and in1 at phase detector 13 and multiplying the difference by $2\pi/T_{data}$.

The worst case phase error without the zero-phase restart VCO is $\pi$ radians. Thus, as the data rate increases, ($T_{data}$ decrease to twice the $T_{delay}$), the effective residual error will be $\pi$ radians, which is equal to the worst case possible for the VCO without the restart circuitry. The effectiveness of the prior art is only useful for low VCO frequency (large $T_{data}$ period) and becomes progressively ineffective at higher speeds.

Figure 3:
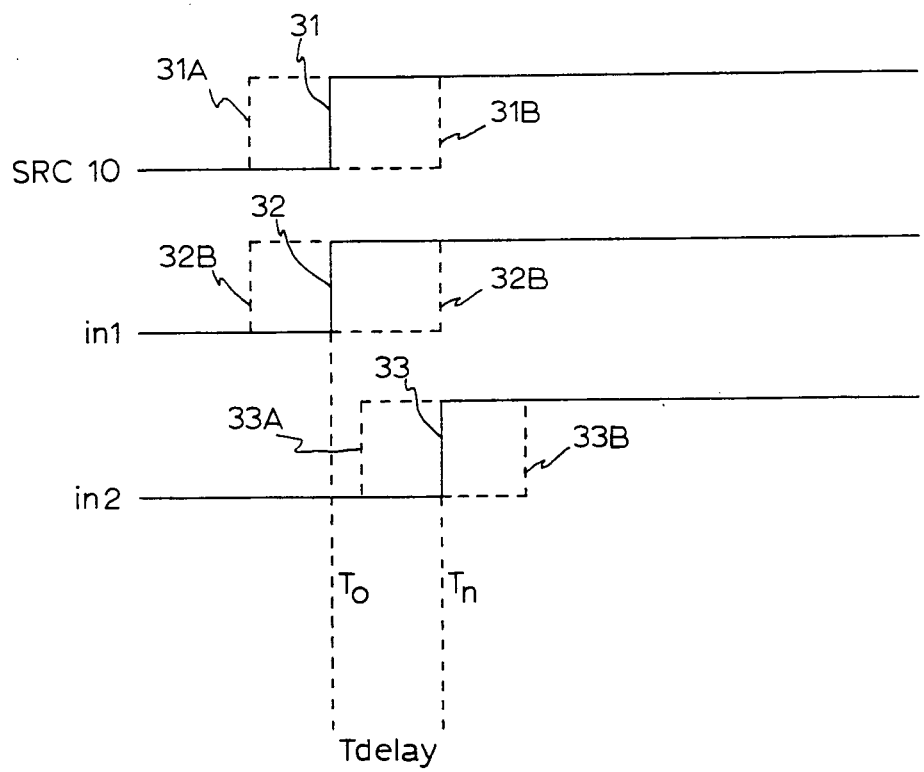
FIG. 3 is timing diagram illustrating the source signal SRC, one phase comparator input in1 and VCO output in2.

FIG. 3 illustrates a timing diagram of the input signal SRC 10 and the signal that inputs in1 and in2 of phase detector 13. At time $T_0$, the SRC 10 signal has a rising edge 31. At the same time, input signal in1 of phase detector 13 has a rising edge 32 (because SRC 10 and in1 are the same signal).

At $T_n$, the input signal into phase detector 13 goes high as indicated by rising edge 33. The difference between $T_n$ and $T_0$ is a delay $T_{delay}$ associated with with the path 24 of FIG. 1.

Figure 4:
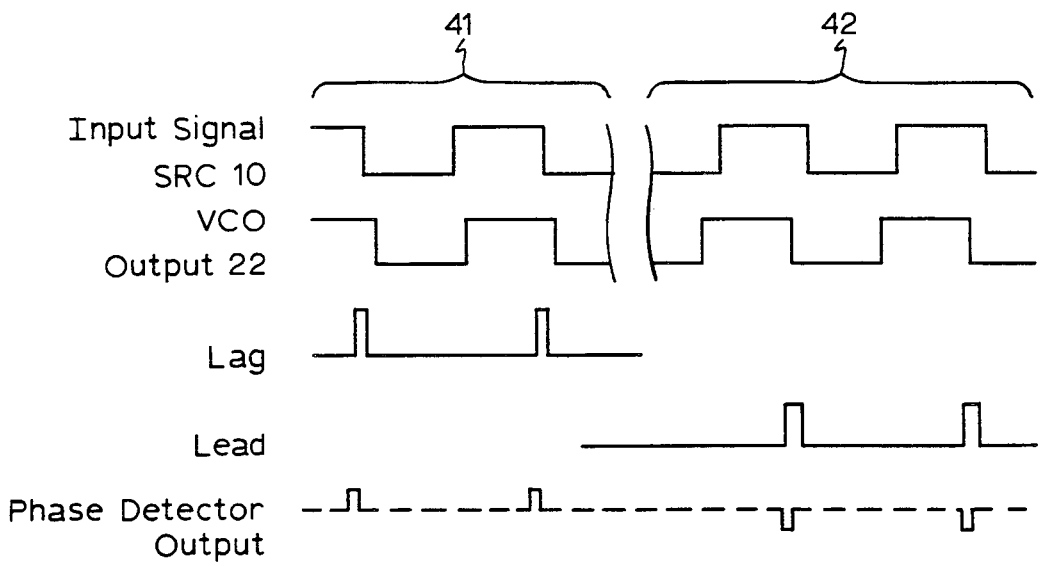
FIG. 4 is a timing diagram illustrating lag and lead signals generated by a phase comparator.

FIG. 4 illustrates the output of the phase comparator depending on the relationship of the input signal SRC 10 and the VCO output signal 22. In region 41, the edges of the input signal SRC 10 occur prior to the occurrence of the edges of the VCO signal 22, that is, the input signal "leads" the VCO signal. The phase detector outputs positive pulses equal in width to the difference between edges of the input signal and VCO signal.

In region 42, the edges of the input signal SRC 10 occur after the occurrence of the edges of the VCO signal 22, that is the input signal "lags" the VCO signal. The phase detector outputs negative going signals. These lead and lag signals are used to generate a control voltage $V_c 27$ to cause changes in the output of VCO 12.

The phase error caused by the delay introduced by the VCO 12 and flip-flop 11 can cause the lead and lag signals to be very large, causing large excursions in the output of VCO 12. This requires a VCO with a wide operating range. This is because the large phase error during phase/frequency acquisition requires the VCO to make a large excursion from the center frequency to lock onto the input signal. This excursion can be greater than 40% in some situations. Such a wide range VCO can add to the cost of the data recovery circuit as well as limit performance parameters. In addition, the performance of such a prior art system degrades with higher data rates since the residual phase error approaches $\pi$ radians at higher data rates.

Another disadvantage of such a prior art VCO restart system is an unwanted reduction of VCO phase window margin. Referring again to FIG. 3, there may be "jitter" associated with the input signal SRC 10. That is, the SRC signal 10 may occur at rising edge 31A or at rising edge 31B, before or after the nominal rising edge 31. This results in a shift to the rising edge of input signal in1 of phase detector 13 to rising edge 32A or rising edge 32B and similarly, a shift in the occurrence of rising edge 33 of input in2 to rising edge 33A or rising edge 33B.

There is a maximum theoretical limit to the jitter associated with the incoming signal. This limit is determined by the tolerances and performance of the data recovery circuitry. However, the jitter limit may be reduced as much as 35% from the theoretical limit due to the residual phase delay and the VCO restart circuitry in a typical circuit. The amount of jitter reduction is implementation-dependent and may be greater or less in other implementations. Thus the window margin of the prior art circuitry is reduced.

Figure 2:
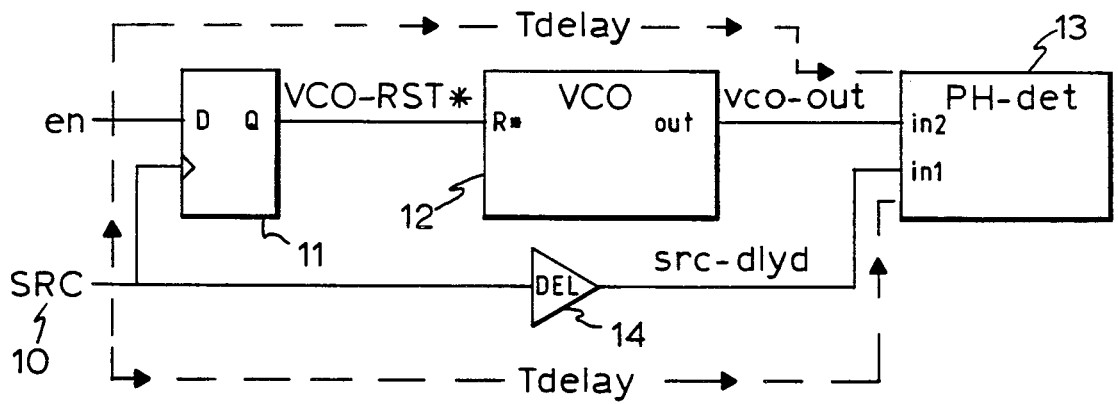
FIG. 2 is a diagram illustrating the preferred embodiment of the present invention.

A block diagram illustrating the preferred embodiment of the present invention is illustrated in FIG. 2. The present invention provides delay circuitry in the zero delay path between the data signal and phase detector. The delay circuitry effectively removes the residual phase error by matching the time delay seen in the restart circuitry path. Incoming data signal SRC 10 is coupled to the clock input of D-type flip-flop 11, and also coupled on line 23 to the input of delay circuit 14. The output 26 of delay circuit 14 is coupled to the input in1 of phase detector 13. The output 21 of D-type flip-flop 11 is coupled to the reset input of VCO 12. The output 22 of VCO 12 is coupled to input in2 of phase detector 13. Control voltage $V_c 27$ is coupled in a feedback loop to VCO 12.

Delay circuit 14 delays the incoming data signal 10 to input in1 of phase detector 13 by an amount equal to the delay seen from data signal 10 to input in2 of phase detector 13. This ensures that the phase difference between the two input signals of phase detector 13 will be zero at restart for all data rates.

The present invention is extremely valuable for data separator designs that use a VCO to generate a window for incoming data. The present invention allows the VCO to operate with reduced ranged since the VCO is no longer required to make a large excursion during phase/frequency acquisition. Another advantage is that higher data rates can be realized without degrading performance, since the headroom that is used as a buffer during acquisition (the large frequency excursion of greater than 40%) in the prior art is no longer required and can now be used as a center frequency of the data signal. Thus, smaller headroom is required with the present invention (frequency excursion of 10% or less, approximately).

By eliminating the phase error, the present invention avoids the problem of reduction of VCO phase window margin. The present invention maintains the jitter tolerances near the theoretical limit. This regained window margin from the prior art allows the overall system to become more robust against the jitters of the incoming data, resulting in less restrictive requirements for the jitter of the incoming data.

Thus, a zero phase restart compensation circuit for a VCO has been described.

We claim:

1. A circuit comprising:
    enabling means for providing a first output signal when said enabling means receives an input signal;
    clock generating means coupled to said enabling means for providing a second output signal when said clock generating means receives said first output signal, said second output signal provided after a first time delay after said input signal is provided to said enabling means;
    delay means coupled to said input signal for introducing a second time delay to said input signal, said delay means providing a third output signal;
    phase detecting means coupled to said clock generating means and to said delay means for comparing a frequency of said second output signal with a frequency of said third output signal;
    said delay means such that said first time delay is substantially equal to said second time delay.

2. The circuit of claim 1 wherein said enabling means comprises a flip-flop with said input signal coupled to a clock input of said flip-flop.

3. The circuit of claim 1 wherein said clock generating means comprises a voltage controlled oscillator (VCO) and said first output signal is coupled to a reset input of said VCO.

4. The circuit of claim 1 wherein said phase detecting means comprises a phase detector.

5. The circuit of claim 1 wherein said delay means comprises a delay element.

6. A circuit comprising:
    enabling means for generating a reset signal when said enabling means receives an input signal;
    a voltage controlled oscillator (VCO) coupled to said enabling means, said VCO triggered by said reset signal and providing a clock output signal, said clock output signal provided after a first time delay after said input signal is provided to said enabling means;
    delay means coupled to said input signal and providing a delayed output signal after a second time delay after said input signal is provided to said delay means;
    phase comparing means coupled to said clock output signal and to said delayed output signal for comparing a frequency of said clock output signal and a frequency of said delayed signal;
    said first time delay substantially equal to said second time delay.

7. The circuit of claim 6 wherein said enabling means comprises a flip-flop and said input signal is coupled to a clock input of said flip-flop.

8. The circuit of claim 7 wherein said reset signal is coupled to a reset input of said VCO.

9. The circuit of claim 8 wherein said phase comparing means comprises a phase detector.

10. The circuit of claim 9 wherein said delay means comprises a delay element.

11. A method of reducing phase delay in a circuit comprising the steps of:
    providing an input signal to an enabling means, said enabling means providing a reset signal;
    providing said reset signal to a voltage controlled oscillator (VCO) to initialize said VCO to produce a clock output after a time delay T1 after said input signal is provided to said enabling means;
    providing said clock output to a first input of a phase comparator;
    introducing a time delay T2 to said input signal and providing said delayed input signal to a second input of said phase comparator, T2 being substantially equal to T1.

12. The method of claim 11 wherein said enabling means comprises a flip-flop.

13. The method of claim 11 wherein said step of introducing a time delay T2 to said input signal is performed by coupling said input signal to a delay element.

14. The method of claim 11 wherein said reset signal is provided to a reset input of said VCO.

* * * * *